United States Patent
Lee et al.

(10) Patent No.: US 10,224,152 B2
(45) Date of Patent: Mar. 5, 2019

(54) ELECTROLYTE FOR DYE-SENSITIZED SOLAR CELL AND METHOD FOR PREPARING SAME

(71) Applicant: National Cheng Kung University, Tainan (TW)

(72) Inventors: Yuh-Lang Lee, Tainan (TW); Sung-Chuan Su, Tainan (TW); Wei-Ning Hung, Tainan (TW); Jian-Ci Lin, Tainan (TW)

(73) Assignee: National Cheng Kung University, Tainan (TW)

( * ) Notice: Subject to any disclaimer, the term of this patent is extended or adjusted under 35 U.S.C. 154(b) by 198 days.

(21) Appl. No.: 15/241,604

(22) Filed: Aug. 19, 2016

(65) Prior Publication Data

US 2017/0053747 A1  Feb. 23, 2017

(30) Foreign Application Priority Data

Aug. 21, 2015  (TW) .............................. 104127409 A

(51) Int. Cl.
*H01G 9/20* (2006.01)
*H01L 51/00* (2006.01)

(52) U.S. Cl.
CPC ......... *H01G 9/2013* (2013.01); *H01L 51/004* (2013.01); *H01L 51/0043* (2013.01); *Y02E 10/542* (2013.01)

(58) Field of Classification Search
CPC ... H01G 9/2013; H01G 9/2004; Y02E 10/542
See application file for complete search history.

(56) References Cited

U.S. PATENT DOCUMENTS

| | | | | |
|---|---|---|---|---|
| 7,323,635 B2* | 1/2008 | Chittibabu | ........... | H01G 9/2031 136/256 |
| 8,455,586 B2* | 6/2013 | Lee | ...................... | H01G 9/2004 252/62.2 |
| 8,758,639 B2* | 6/2014 | Lee | ...................... | H01G 9/2009 136/263 |
| 9,899,703 B2* | 2/2018 | Yoshida | ............ | H01M 10/0565 |
| 2005/0028862 A1* | 2/2005 | Miteva | ................. | H01G 9/2009 136/263 |
| 2007/0102039 A1* | 5/2007 | Kim | ...................... | H01G 9/2009 136/263 |

(Continued)

FOREIGN PATENT DOCUMENTS

WO   WO 2014133171   * 9/2014

*Primary Examiner* — C Melissa Koslow
(74) *Attorney, Agent, or Firm* — Soroker Agmon Nordman

(57) ABSTRACT

An electrolyte for a dye-sensitized solar cell is disclosed. The electrolyte includes a solvent being one selected from a group consisting of gamma-butyrolactone (gBL), propylene carbonate (PC) and 3-methoxypropionitrile (MPN), and a polymer mixed with the solvent to form an electrolyte solution, wherein when the solvent is one of gBL and PC, the polymer is one selected from a group consisting of polyacrylonitrile (PAN), polyvinyl acetate (PVA), poly(acrylonitrile-co-vinyl acetate) (PAN-VA) and a combination thereof; and when the solvent is MPN, the polymer includes one of a mixture of poly(ethylene oxide) (PEO) and polyvinylidene fluoride (PVDF), and a mixture of PEO and polymethylmethacrylate (PMMA).

11 Claims, 6 Drawing Sheets

(56) References Cited

U.S. PATENT DOCUMENTS

| | | | | |
|---|---|---|---|---|
| 2008/0115831 A1* | 5/2008 | Kang | ............... | H01G 9/2004 |
| | | | | 136/263 |
| 2010/0267849 A1* | 10/2010 | Lee | ............... | H01G 9/2004 |
| | | | | 521/38 |
| 2011/0126900 A1* | 6/2011 | Inoue | ............... | H01G 9/2095 |
| | | | | 136/256 |
| 2014/0216536 A1* | 8/2014 | Ting | ............... | H01G 9/2031 |
| | | | | 136/256 |
| 2014/0220731 A1* | 8/2014 | Ting | ............... | H01G 9/2031 |
| | | | | 438/98 |

* cited by examiner

ELECTROLYTE FOR DYE-SENSITIZED SOLAR CELL AND METHOD FOR PREPARING SAME

CROSS-REFERENCE TO RELATED APPLICATION AND CLAIM OF PRIORITY

The application claims the benefit of the Taiwan Patent Application No. 104127409, filed on Aug. 21, 2015, at the Taiwan Intellectual Property Office, the disclosures of which are incorporated herein in their entirety by reference.

FIELD OF THE INVENTION

The present invention is related to a method for manufacturing an electrolyte. In particular, the present invention is related to a method for manufacturing an electrolyte for a dye-sensitized solar cell.

BACKGROUND OF THE INVENTION

As shown in FIG. 1, a widely-known dye-sensitized solar cell (DSSC) device 1 comprises a working electrode 2, which includes a substrate 21, a transparent conductive film 22, a $TiO_2$ semiconductor film 24 for absorbing a dye (not shown), an electrolyte solution 3 and a counter electrode 4, which includes a substrate 41, a transparent conductive film 42 and a palladium catalyst 43. The electrolyte solution popularly used presently is a liquid electrolyte because the manufacturing cost is low. After the dye-sensitized solar cell device 1 is assembled and thermally pressed, the dye-sensitized solar cell is drilled to form a hole (not shown in FIG. 1) thereon. The liquid electrolyte solution 3 is injected into the dye-sensitized solar cell via the hole, and the hole is sealed thereafter. However, using the injection method will cause the problems of non-uniform injection, difficult sealing, and easy leakage of the solvent in the electrolyte solution. Moreover, because the solvent contained in the electrolyte solution 3 has high saturated evaporation pressure, the electrolyte solution 3 is flammable, evaporable, unstable and has poor dye adsorption, resulting from the evaporation of the solvent.

Another electrolyte solution widely used is called a gelatinous electrolyte. However, when the gelatinous electrolyte is applied to form a thin film to assemble a dye-sensitized solar cell device, the solvent contained in the gelatinous electrolyte can easily evaporate during the manufacturing processes. Therefore, the composition of the gelatinous electrolyte will change and cause the dye-sensitized solar cell to be unstable.

Therefore, the Applicant has invented an electrolyte for a dye-sensitized solar cell and a method of preparing the same to improve the shortcomings of the prior art mentioned above.

SUMMARY OF THE INVENTION

In accordance with one aspect of the present invention, an electrolyte for a dye-sensitized solar cell device is disclosed. The electrolyte includes a solvent being one selected from a group consisting of gamma-butyrolactone (gBL), propylene carbonate (PC) and 3-methoxypropionitrile (MPN); and a polymer mixed with the solvent to form an electrolyte solution, wherein when the solvent is one of gBL and PC, the polymer includes one selected from a group consisting of polyacrylonitrile (RAN), polyvinyl Acetate (PVA), poly-acrylonitrile co-vinyl acetate) (PAN-VA) and a combination thereof; and when the solvent is MPN, the polymer includes one of a mixture of poly(ethylene oxide (PEO) and polyvinylidene fluoride (PVDF), and a mixture of PEO and polymethylinethacrylate (PMMA).

In accordance with another aspect of the present invention, an electrolyte for a dye-sensitized solar cell is disclosed. The electrolyte includes a solvent and a thickening agent to form an electrolyte solution having a viscosity of 1.3-40 Pa·s.

In accordance with a further aspect of the present invention, a method for preparing an electrolyte is disclosed. The method includes steps of providing a solvent being one selected from a group consisting of lactone, carbonate and nitrile, and adding a polymer to the solvent to form an electrolyte solution, wherein the polymer is one selected from a group consisting of polyacrylonitrile (PAN), polyvinyl acetate (PVA), poly(acrylonitrile-co-vinyl acetate) (PAN-VA), a combination thereof, a combination of poly(ethylene oxide) (PEO) and polyvinylidene fluoride (PVDF) and a combination of PEO and polymethylmethacrylate (PMMA).

BRIEF DESCRIPTION OF THE DRAWINGS

The embodiments of the present invention will be clearly shown in the accompanying drawings, wherein.

DETAILED DESCRIPTION OF THE PREFERRED EMBODIMENTS

Figure 1:
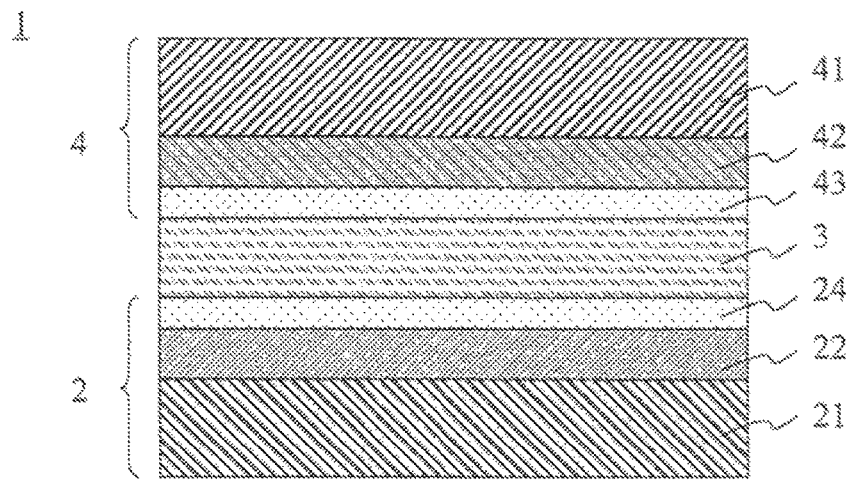
FIG. 1 is a schematic drawing of a prior dye-sensitized solar cell.

The present invention will now be described more specifically with reference to the following embodiments. It is to be noted that the following descriptions of preferred embodiments of this invention are presented herein for the purposes of illustration and description only; they are not intended to be exhaustive or to be limited to the precise form disclosed.

In order to select the solvent to prepare a printable electrolyte solution in the present invention, it was first considered to choose a solvent with low evaporation pressure to prevent the solvent in the prepared electrolyte solution from easily evaporating. According to one embodiment of the present invention, gamma-butyrolactone (gBL), propylene carbonate (PC) or 3-Methoxypripionitrile (MPN), each of which has a saturated evaporation pressure lower than 1 KPa at 25° C., can be selected. Their physical characteristics are shown in Table 1. Meanwhile, to prevent desorption of the dye adsorbed in the working electrode, the donor number of the selected solvent cannot be too high. According to one embodiment of the present invention, the donor number of the solvent suitable for the present invention should not exceed 18 kcal/mol. Solvents having similar properties, such as lactone, carbonate, or nitrile, are applicable to the present invention as long as the properties of the solvents can meet the requirements mentioned above.

TABLE 1

| Solvent | Saturated evaporation pressure (KPa at 25° C.) | Donor number (Kcal/mol) |
|---|---|---|
| gBL | 0.23 | 18 |
| PC | 0.006 | 15.1 |
| MPN | 0.2 | 15.4 |

To increase the viscosity of the electrolyte solution so that the electrolyte solution has printable characteristics, the polymer soluble in the solvent is selected as a thickening agent in the present invention. After mixing with the thickening agent, the electrolyte solution will not gel, and the selected polymer can effectively trap the solvent so that a phenomena called "solvent separation" resulting from low polymer content will not occur. According to one embodiment of the present invention, when the selected solvent is gBL or PC, the thickening agent can be selected from a group consisting of polyacrylonitrile (PAN), polyvinyl acetate (PVA), poly(acrylonitrile-co-vinyl acetate (PAN-VA), a combination thereof, and poly(ethylene oxide) (PEO) and polyvinylidene fluoride (PVDF). When the selected solvent is MPN, the thickening agent can include one of a mixture of PEO and PVDF, and a mixture of PEO and polymethylmethacrylate (PMMA). As long as the selections of the solvent and the polymer meet the aforementioned conditions, any proper combination or replacement thereof is still within the scope of the present invention.

According to one embodiment of the present invention, in addition to the solvent and the polymer contained in the electrolyte solution, assisting conductive particles can also be added to the electrolyte solution to increase the photoelectric conversion efficiency. The addition of the assisting conductive particles causes the dye-sensitized solar cell to be much more stable without desorption of the dye adsorbed in the working electrode. According to one embodiment of the present invention, titanium carbide (TiC), titanium dioxide ($TiO_2$) or silicon dioxide ($SiO_2$) nanoparticles can be selected as the assisting conductive particles.

In addition, according to one embodiment of the present invention, other additives can be added to the electrolyte solution to provide oxidation-reduction (redox) electron pairs. The additives include at least one of iodine, lithium iodide, 1,3-dimethylimidazolium iodide (DMII), N-methylimidazole (NMBI) and guanidinium thiocyanate (GuSCN). These additives dissolved in gBL can be, but are not limited to, 0.05M iodine, 0.1M lithium iodide, 0.8M DMII, 0.5M NMBI, 0.1M GuSCN or a combination thereof.

Figure 2:
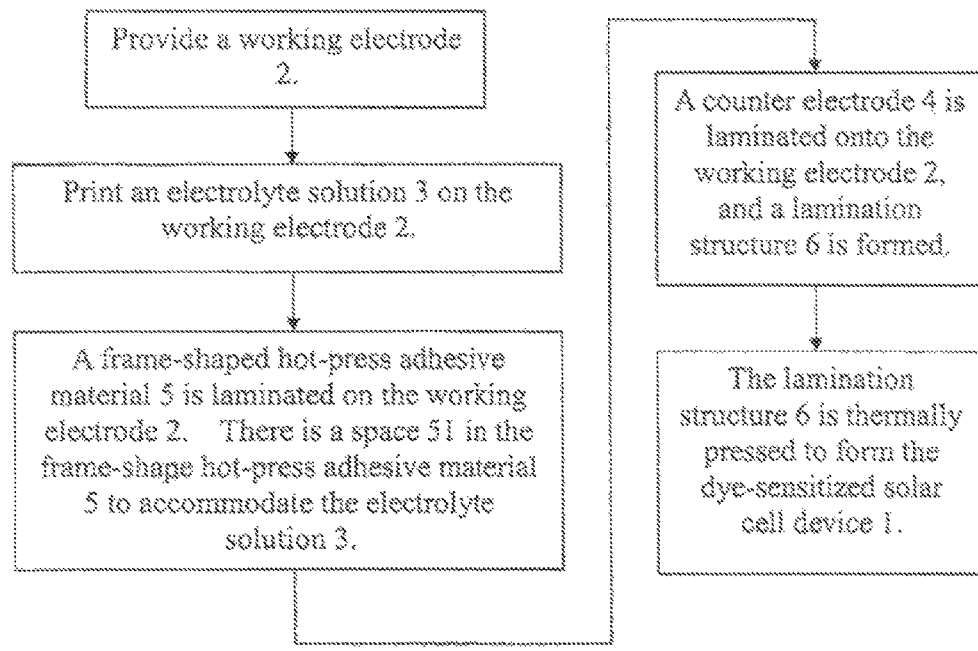
FIG. 2 is a flow diagram showing a manufacturing process of a preferred embodiment of a dye-sensitized solar cell according to the present invention.
Figure 3A:
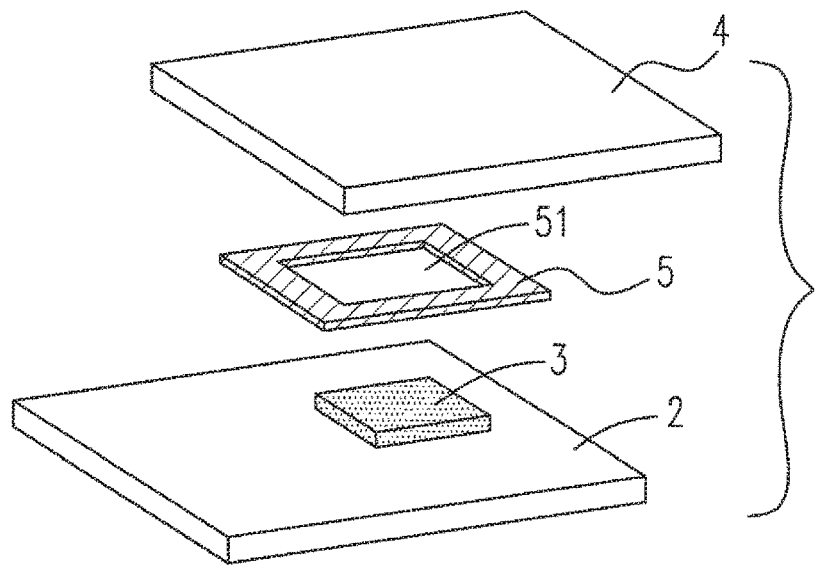
FIGS. 3A and 3B are schematic drawings showing two structures of the preferred embodiments of the dye-sensitized solar cell devices according to the present invention.
Figure 3B:
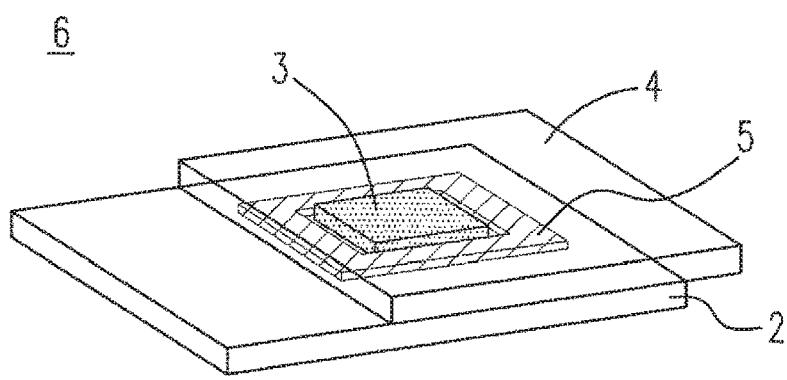

FIG. 2 is a flow diagram showing a manufacturing process for one preferred embodiment of a dye-sensitized solar cell device of the present invention. FIGS. 3A and 3B are schematic drawings showing two structures of the preferred embodiments of the dye-sensitized solar cell device 1 of the present invention. According to one embodiment of the present invention and referring to FIGS. 2, 3A and 3B, a printing process, such as a screen printing process, a blade printing process, or an ink-jet printing process, is adopted to coat an electrolyte solution 3 on a working electrode 2. A frame-shaped thermal-press adhesive material 5 is then laminated onto the working electrode 2. The frame-shaped thermal-press adhesive material 5 has a space 51 so that the electrolyte solution 3 can be accommodated therein, and forms a constraint space to limit the flow of the electrolyte solution 3. The space 51 is slightly larger than the volume of the electrolyte solution 3. When the frame-shaped thermal-press adhesive material 5 is placed on the working electrode 2, it will not contact the electrolyte solution 3. After that, a counter electrode 4 is laminated onto the working electrode 2, and a lamination structure 6 is formed. Finally, the lamination structure 6 is thermally pressed to form the dye-sensitized solar cell device 1, and the photoelectric characteristics of the device were evaluated.

Regarding the preparation of the electrolyte solution, first, according to one embodiment of the present invention, gBL is used as the solvent, PAN is used as the thickening agent, and one selected from the group consisting of 0.5M iodine, 0.1M lithium iodide, 0.8M DMII, 0.5M NIMBI, 0.1M GuSCN and a combination thereof is added to provide the redox electron pairs to the electrolyte solution. Combinations of different concentrations of the thickening agent were evaluated to learn which electrolyte solutions with various viscosities are suitable for the printing process. The electrolyte solutions with and without added TiC nanoparticles were compared. The compositions and the viscosities of the prepared electrolyte solutions are shown in Table 2.

TABLE 2

| Example | Solvent | Thickening agent | Viscosity of the electrolyte solution (Pa · s) |
|---|---|---|---|
| 1-1 | gBL | — | 0.017 |
| 1-2 | gBL | 4 wt % PAN | 1.36 |
| 1-3 | gBL | 9 wt % PAN | 24.7 |
| 1-4 | gBL | 12 wt % PAN | 37.3 |

The prepared electrolyte solution in Example 1-1 does not have the thickening agent, and the viscosity, of the electrolyte solution is 0.017 Pa·s. Due to its low viscosity and high flowability, the electrolyte solution in Example 1-1 is not suitable for coating using the printing process. In comparison, the viscosities of the electrolyte solutions prepared in Examples 1-2 to 14 increase to a range, between about 1.3 and 40 Pa·s, meaning that the electrolyte solutions are close to a gel state. Accordingly, the electrolyte solutions in Examples 1-2 to 14 will not flow and the solvent gBL will not easily evaporate. Therefore, an electrolyte solution with a viscosity within this range is suitable for coating using the printing process.

The next step was to combine the solvents and thickening agents in different compositions and ratios to prepare the electrolyte solutions. Before adding the thickening agent, 0.05M iodine, 0.1M lithium iodide, 0.8M DMII, 0.5M NMBI or 0.1M GuSCN was added to the solvents so that the redox electron pairs are available in the electrolyte solutions. The prepared electrolyte solutions were printed to manufacture the dye-sensitized solar cell devices, and these devices were tested. The properties are shown in Table 3, in which the short circuit current (Jsc), open circuit voltage (Voc), fill factor (FF), photoelectric conversion efficiency (η), conductivity, and resistance (Rpt) between the palladium catalyst 43 and the electrolyte solution 3 were evaluated.

TABLE 3

| Example | Solvent | Thickening agent | Assisting conductive particle | Jsc (mA/cm$^2$) | Voc (V) | FF | η (%) | Conductivity (S/cm · 10$^3$) | Rpt (Ω) |
|---|---|---|---|---|---|---|---|---|---|
| 1-1 | gBL | 4 wt % PAN | — | 15.43 | 0.751 | 0.65 | 7.53 | — | — |
| 1-2 | gBL | 9 wt % PAN | — | 15.10 | 0.761 | 0.65 | 7.47 | — | — |
| 1-3 | gBL | 12 wt % PAN | — | 14.86 | 0.752 | 0.63 | 7.04 | — | — |
| 2-1 | gBL | 10 wt % PVA | — | 14.33 | 0.779 | 0.66 | 7.39 | — | — |
| 2-2 | gBL | 15 wt % PVA | — | 14.25 | 0.778 | 0.64 | 7.14 | — | — |
| 2-3 | gBL | 20 wt % PVA | — | 13.87 | 0.769 | 0.64 | 6.78 | — | — |
| 2-4 | gBL | 30 wt % PVA | — | 10.81 | 0.708 | 0.70 | 5.35 | — | — |
| 3-1 | gBL | 12 wt % PAN | 1 wt % TiO$_2$ | 15.86 | 0.750 | 0.63 | 7.43 | 2.25 | 0.85 |
| 3-2 | gBL | 12 wt % PAN | 4 wt % TiO$_2$ | 16.09 | 0.744 | 0.63 | 7.54 | 2.39 | 0.98 |
| 3-3 | gBL | 12 wt % PAN | 7 wt % TiO$_2$ | 15.45 | 0.739 | 0.62 | 7.13 | 2.29 | 0.91 |
| 3-4 | gBL | 12 wt % PAN | 10 wt % TiO$_2$ | 15.16 | 0.734 | 0.63 | 7.01 | 2.03 | 0.87 |
| 3-5 | gBL | 12 wt % PAN | — | 15.54 | 0.743 | 062 | 7.10 | 1.88 | 1.71 |
| 3-6 | gBL | 12 wt % PAN | 1 wt % TiC | 15.88 | 0.728 | 0.64 | 7.40 | 1.99 | 1.38 |
| 3-7 | gBL | 12 wt % PAN | 4 wt % TiC | 16.36 | 0.723 | 0.63 | 7.45 | 2.07 | 1.02 |
| 3-8 | gBL | 12 wt % PAN | 7 wt % TiC | 16.14 | 0.723 | 0.63 | 7.35 | 2.15 | 1.09 |
| 3-9 | gBL | 12 wt % PAN | 10 wt % TiC | 15.86 | 0.716 | 0.62 | 7.04 | 1.94 | 1.13 |
| 3-10 | gBL | 9 wt % PAN | 4 wt % TiC | 15.73 | 0.743 | 0.66 | 7.68 | — | — |
| 4-1 | gBL | 10 wt % PVA | — | 14.15 | 0.774 | 0.65 | 7.13 | — | — |
| 4-2 | gBL | 7 wt % PAN-VA | — | 14.44 | 0.771 | 0.65 | 7.20 | — | — |
| 4-3 | gBL | 4 wt % PAN | — | 14.67 | 0.777 | 0.66 | 7.52 | — | — |
| 5-1 | MPN | 8 wt % PEO | — | 13.16 | 0.773 | 0.70 | 7.28 | — | — |
| 5-2 | MPN | 10 wt % PEO | — | 12.84 | 0.775 | 0.70 | .7.10 | — | — |
| 5-3 | MPN | 15 wt % PEO | — | 13.90 | 0.740 | 0.68 | 7.00 | — | — |
| 5-4 | MPN | 8 wt % + PEO 1 wt % PVDF | — | 14.16 | 0.786 | 0.69 | 7.72 | — | — |
| 5-5 | MPN | 8 wt % PEO + 1 wt % PVDF | 4 wt % TiO$_2$ | 15.25 | 0.774 | 0.69 | 8.17 | — | — |
| 6-1 | MPN | 8 wt % PEO | — | 13.39 | 0.763 | 0.70 | 7.36 | — | — |
| 6-2 | MPN | 8 wt % PEO | 4 wt % TiO$_2$ | 14.96 | 0.779 | 0.70 | 8.23 | — | — |
| 6-3 | MPN | 8 wt % PEO + 1 wt % PVDF | — | 14.16 | 0.786 | 0.69 | 7/72 | — | — |
| 6-4 | MPN | 8 wt % PEO + 1 wt % PVDF | 4 wt % TiO$_2$ | 15.34 | 0.785 | 0.69 | 8.35 | — | — |
| 6-5 | MPN | 8 wt % PEO + 2 wt % PVDF | — | 14.64 | 0.740 | 0.69 | 7.51 | — | — |
| 6-6 | MPN | 8 wt % PEO + 2 wt % PVDF | 4 wt % TiO$_2$ | 14.80 | 0.785 | 0.69 | 8.06 | — | — |
| 7-1 | MPN | 8 wt % PEO + 1 wt % PVDF | — | 14.49 | 0.750 | 0.68 | 7.37 | — | — |
| 7-2 | MPN | 8 wt % PEO + 1 wt % PVDF | 4 wt % TiO$_2$ | 15.52 | 0.752 | 0.67 | 7.92 | — | — |
| 7-3 | MPN | 8 wt % PEO + 1 wt % PVDF | 4 wt % TiC | 14.82 | 0.750 | 0.68 | 7.60 | — | — |
| 7-4 | MPN | 8 wt % PEO + 1 wt % PVDF | 4 wt % SiO$_2$ | 14.42 | 0.751 | 0.65 | 6.95 | — | — |
| 8-1 | MPN | — | — | 13.86 | 0.736 | 0.71 | 7.21 | — | — |

TABLE 3-continued

| Example | Solvent | Thickening agent | Assisting conductive particle | Jsc (mA/cm$^2$) | Voc (V) | FF | η (%) | Conductivity (S/cm · 10$^3$) | Rpt (Ω) |
|---|---|---|---|---|---|---|---|---|---|
| 8-2 | MPN | — | 2 wt % TiO$_2$ | 14.90 | 0.749 | 0.70 | 7.78 | — | — |
| 8-3 | MPN | — | 4 wt % TiO$_2$ | 15.87 | 0.743 | 0.68 | 8.07 | — | — |
| 8-4 | MPN | — | 6 wt % TiO$_2$ | 15.48 | 0.741 | 0.70 | 7.97 | — | — |
| 8-5 | MPN | — | 8 wt % TiO$_2$ | 15.11 | 0.736 | 0.70 | 7.76 | — | — |
| 9-1 | MPN | 8.1 wt % PEO + 0.9 wt % PMMA | — | 14.34 | 0.784 | 0.73 | 8.17 | — | — |
| 9-2 | MPN | 6.3 wt % PEO + 2.7 wt % PMMA | — | 15.27 | 0.768 | 0.73 | 8.50 | — | — |
| 9-3 | MPN | 6.125 wt % PEO + 4.375 wt % PMMA | — | 15.17 | 0.770 | 0.72 | 8.42 | — | — |
| 9-4 | MPN | 6.1 wt % PEO + 6.1 wt % PMMA | — | 15.09 | 0.760 | 0.71 | 8.16 | — | — |
| 10-1 | PC | 7 wt % PVA | — | 13.90 | 0.743 | 0.61 | 6.31 | — | — |
| 10-2 | PC | 10 wt % PVA | — | 13.86 | 0.748 | 0.62 | 6.43 | — | — |
| 10-3 | PC | 12 wt % PVA | — | 13.81 | 0.730 | 0.59 | 5.94 | — | — |
| 10-4 | PC | 15 wt % PVA | — | 12.89 | 0.723 | 0.60 | 5.62 | — | — |

Following that, the electrolyte solutions according to the present invention were injected into the dye-sensitized solar cell devices using a common injection process. The photoelectric characteristics of these devices were evaluated and are shown in Comparative Examples 1-1 to 1-2, 2-1 to 2-2, and 3-1 in Table 3.

TABLE 4

| Comparative Example | Solvent | Thickening agent | Assisting conductive particle | Jsc (mA/cm$^2$) | Voc (V) | FF | η (%) |
|---|---|---|---|---|---|---|---|
| 1-1 | gBL | — | — | 16.01 | 0.751 | 0.66 | 7.94 |
| 1-2 | gBL | — | — | 15.81 | 0.745 | 0.66 | 7.76 |
| 2-1 | MPN | — | — | 15.06 | 0.755 | 0.68 | 7.73 |
| 2-2 | MPN | — | — | 13.86 | 0.736 | 0.71 | 7.21 |
| 3-1 | PC | — | — | 14.33 | 0.724 | 0.61 | 6.32 |

Please refer to Table 3. In Examples 1-2 to 1-3, gBL is used as the solvent, in which PAN as the thickening agent was dissolved in concentrations of 4 wt %, 9 wt % and 12 wt %, without adding the assisting conductive particles, and the electrolyte solutions having proper viscosities ranged from 1.3 to 40 Pa·S were obtained. When the viscosities of the electrolyte solutions are within this range, the added thickening agent has good dispersion. After the dye-sensitized solar cell devices were assembled and their photoelectric characteristics were measured, it was found that the photoelectric conversion efficiency (η) was at least 7.53% when PAN concentration is 4 wt %, at least 7.04% when PAN concentration is 12 wt %, and at least 7.47% when PAN is 9 wt %. In comparison with Comparative Example 1-1 as shown in Table 4, the dye-sensitized solar cell device manufactured using gBL as the solvent in the injection process, the photoelectric conversion efficiency (η) is 7.94%. Although the photoelectric conversion efficiency of the electrolyte solutions in Examples 1-2 to 1-3 of the present invention are not as high as that in Comparative Example 1-1, these formulations are suitable for the printing process and can be used for mass production of the dye-sensitized solar cell devices.

In Examples 2-1 to 2-4, PAN having concentrations of 10 wt %, 15 wt %, 20 wt % and 30 wt % was used as the thickening agent. The photoelectric characteristics of each of the assembled dye-sensitized solar cell device 2 were measured. The best of the results is that the photoelectric conversion efficiency (η) was at least 7.39% when the PAN concentration is 10 wt %.

To more efficiently improve the photoelectric conversion efficiency (η) of the dye-sensitized solar cell devices manufactured in Examples 1-1 to 1-3, gBL was adopted as the solvent, and 12 wt % PAN, which causes the lower photoelectric conversion efficiency (η) in Examples 1-1 to 1-3, is used as the thickening agent, and 0 wt %, 1 wt %, 4 wt %, 7 wt %, and 10 wt % titanium oxide (TiO$_2$) nanoparticles were added as the assisting conductive particles. The test results are shown in Examples 3-1 to 3-4. When the TiO$_2$ concentration is 10 wt %, the photoelectric conversion efficiency is 7.01%, when the TiO$_2$ concentration is 0-4 wt %, the photoelectric conversion efficiency (η) can reach at least 7.31-7.54%, and when the TiO$_2$ concentration is 4 wt %, the conductivity can be improved to 2.39 S/cm 10$^3$, and the resistance (Rpt) between the electrolyte solution 3 and the counter electrode 4 is reduced to a value below 0.98Ω. The photoelectric characteristics regarding the short circuit current (Jsc) and the open circuit voltage (Voc) are also comparable to the Comparative Example 1-1.

Following these results, gBL was again used as the solvent, 9 wt % or 12 wt % PAN as the thickening agent, and titanium carbide (TiC) nanoparticles were added as the assisting conductive particles. The test results are shown in Examples 3-5 to 3-10. When the thickening agent was 12 wt % PAN and 1-7 wt % TiC was added, the photoelectric conversion efficiency (η) of the dye-sensitized solar cell devices manufactured therefrom was improved to 7.35-7.45%, and when the thickening agent was 9 wt % PAN and 4% Tic was added, the photoelectric conversion efficiency (η) of the dye-sensitized solar cell devices manufactured therefrom further improved to 7.68%.

In Examples 4-1 to 4-3, gBL was used as the solvent and 10 wt % PVA, 7 wt % PAN-VA or 4 wt % PAN was respectively dissolved therein as the thickening agent, without adding the assisting conductive particles. The photoelectric characteristics of the assembled dye-sensitized solar cell devices were measured and compared. The photoelectric conversion efficiency (η) was at least 7.13-7.52%.

In Examples 5-1 to 5-3, MPN is used as the solvent and 8 wt % PEO, 10 wt % PEO or 15 wt % PEO was respectively dissolved therein as the thickening agent, without adding the assisting conductive particles. The photoelectric characteristics of the assembled dye-sensitized solar cell devices were measured. The photoelectric conversion efficiency (η) was at least 7.00-7.28%. It is found that the addition of PEO can increase the viscosity of the electrolyte solution, however, the excessive addition of PEO decreases the photoelectric conversion efficiency and causes the electrolyte solution to be gelatinous. When using the mixture of PEO and PVDF as the thickening agent as in Example 5-4, wherein the concentration of PVDF is 1 wt %, the photoelectric conversion efficiency of the assembled dye-sensitized solar cell device increased to 7.72%, the short circuit current (Jsc) increased to 14.16 mA/cm$^2$ and the open circuit voltage (Voc) increased to 0.78V. In this case, the photoelectric characteristics of the dye-sensitized solar cell device further improved. Another test was done to add 4 wt % TiO$_2$ as shown in Example 5-5, the photoelectric conversion efficiency increased to 8.17%, the short circuit current (Jsc) increased to 15.25 mA/cm$^2$, while the open circuit voltage (Voc) decreased to less than 0.774V. Accordingly, it can be seen that, when the mixture of PEO and PVDF was used as the thickening agent, due to the PVDF, the viscosity of the electrolyte solution can be effectively increased without adding excessive PEO. The fluorine ion contained in PVDF helps to ionize the electrolyte solution to increase its conductivity, and thus the photoelectric characteristics of the dye-sensitized solar cell device dramatically increased.

The influence of the concentrations of the assisting conductive particles and PVDF to the photoelectric characteristics of the dye-sensitized solar cell devices was further tested, as shown in Examples 6-1 to 6-6. To compare the photoelectric characteristics of the electrolyte solution with or without the addition of 4 wt % TiO$_2$, MPN was used as the solvent, and 8 wt % PEO was used as the thickening agent in Examples 6-1 and 6-2, a mixture of 8 wt % PEO and 1 wt % PVDF was used as the thickening agent in Examples 6-3 and 6-4, and a mixture of 8 wt % PEO and 2 wt % PVDF was used as the thickening agent in Examples 6-5 and 6-6. It can be seen from the measured photoelectric characteristics that the addition of TiO$_2$ causes better photoelectric conversion efficiency, and the value in Example 6-4 reached up to 8.35%, and the value in Example 6-6, in which the concentration of added PVDF is 2 wt %, also reached at least 8.06%. These results are superior to those in Comparative Examples 2-1 and 2-2.

It can be seen from Examples 6-1 to 6-6 that the concentration of TiO$_2$ being 1 wt % causes better photoelectric characteristics. The influence of the addition of different assisting conductive particles to the photoelectric characteristics of the dye-sensitized solar cell devices are shown in Examples 7-1 to 7-4. In Example 7-1, no assisting conductive particles were added. In Examples 7-2 to 7-4, 4 wt % TiO$_2$, 4 wt % TiC, and 4 wt % SiO$_2$ were respectively added. It can be seen from the experimental data that Example 7-2 with the addition of 4 wt % TiO$_2$ reached the best performance.

The influence of the addition of TiO$_2$ to the photoelectric characteristics of the dye-sensitized solar cell devices is shown in Examples 8-1 to 8-5. MPN was used as the solvent. The concentrations of TiO$_2$ were respectively 0 wt %, 2 wt %, 4 wt %, 6 wt % and 8 wt %. After adding TiO$_2$, the photoelectric conversion efficiency reached at least 7.76%, and the electrolyte solution with 4 wt % TiO$_2$ had the best performance.

The influence of the addition of polymethyl methacrylate (PMMA) to the PEO to form a mixture as a thickening agent in the photoelectric characteristics of the dye-sensitized solar cell devices were also evaluated. MPN was used as the solvent, and no assisting conductive particle is added. The test data are shown in Examples 9-1 to 9-4. The photoelectric conversion efficiency reached at least 8.16%, and the electrolyte solution using the thickening agent of Example 9-2 had the best performance. These results are comparable to the those in Comparative Example 2-1, which used MPN as the solvent and the electrolyte solution was printed using the injection process.

In Examples 10-1 to 10-4, polycarbonate (PC) was used as the solvent and 7 wt %, 10 wt %, 12 wt % and 15 wt % PVA was respectively dissolved therein as the thickening agent, without adding the assisting conductive particles. When the concentration of PVA was 15 wt %, the photoelectric conversion efficiency reached only 6.62%, and when the concentration of PVA was 7 wt % or 10 wt %, the photoelectric conversion efficiency reached at least 6.31% and 6.43% respectively. These results are comparable to or even superior than the photoelectric conversion efficiency of 6.32% in Comparative Example 3-1, which used PC as the solvent and the electrolyte solution was printed using the injection process.

Figure 4:
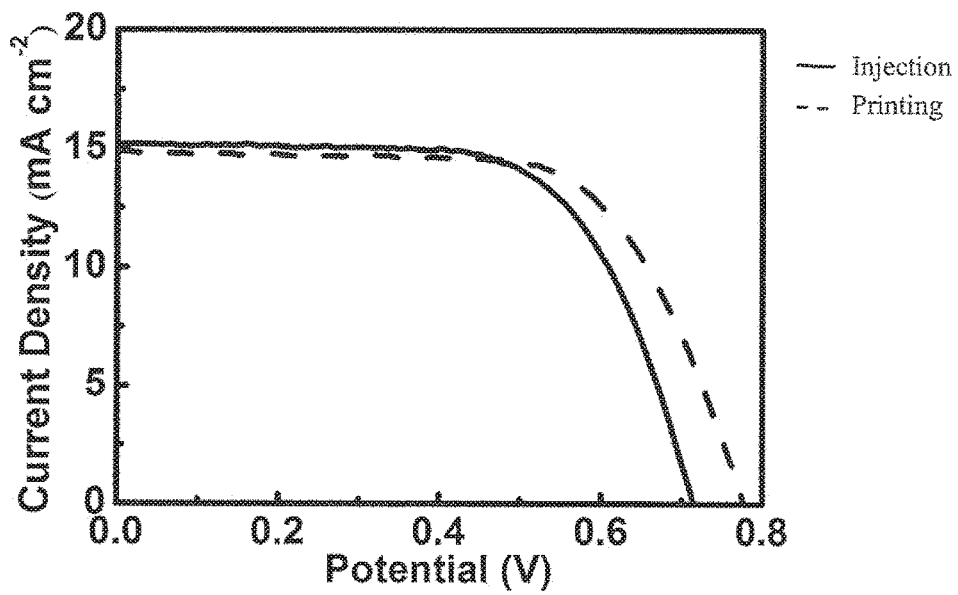
FIG. 4 is a characteristic diagram showing the current vs. voltage curves of the dye-sensitized solar cell devices according to prior art and the present invention.

FIG. 4 is a diagram showing the current vs. voltage curves of the dye-sensitized solar cell devices according to prior art and the present invention, wherein the printing process is used in the present invention, while the injection process is used in the prior art. As shown in FIG. 4, the current degradation of the dye-sensitized solar cell devices of the present invention is lower than that of the prior art in the high voltage area, and the current value of the present invention is comparable to that of the prior art in the low voltage area.

Figure 5:
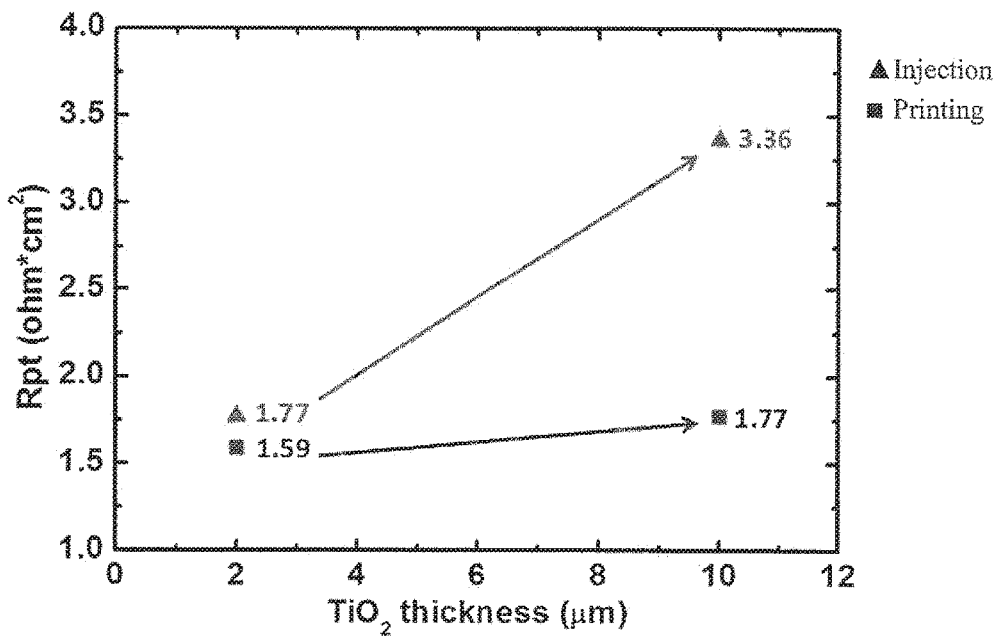
FIG. 5 is a characteristic diagram showing the resistance curves for two dye-sensitized solar cell devices according to the present invention.

FIG. 5 is a diagram showing the resistance curve of two dye-sensitized solar cell devices according to the present invention. As shown in FIG. 5, due to the fact that the electrolyte solution 3 is first printed on the working electrode 2 and then the lamination structure 6 is assembled and thermally-pressed to form the dye-sensitized solar device, the permeability of the electrolyte solution 3, after being thermally-pressed, to the TiO$_2$ semiconductor layer 24 on the working electrode 2 is high. Therefore, even if the thickness of the TiO$_2$ semiconductor layer 24 is large, the dye-sensitized solar cell device maintains a low Rpt value. This characteristic is superior than that of the prior art, in which the thermal press and the injection processes are used.

Figure 6A:
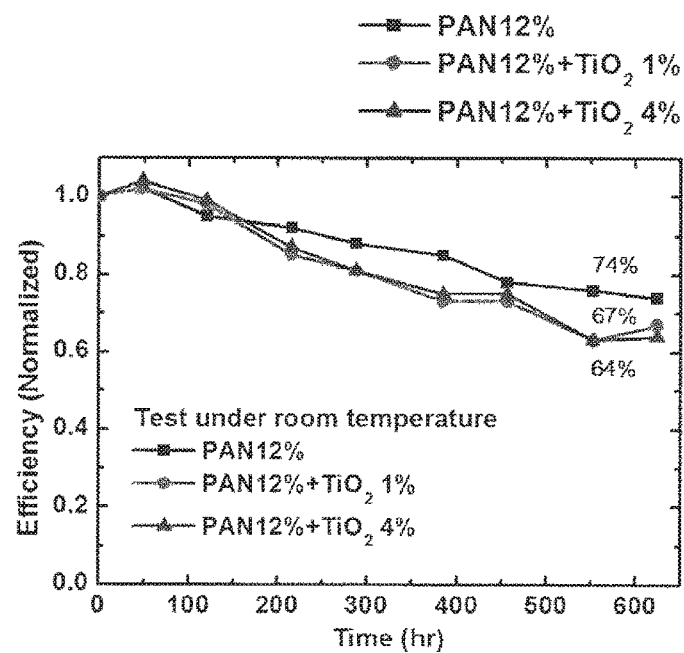
FIGS. 6A-6B are characteristic diagrams showing aging tests for the dye-sensitized solar cell devices using different assisting conductive particles according to the present invention.
Figure 6B:
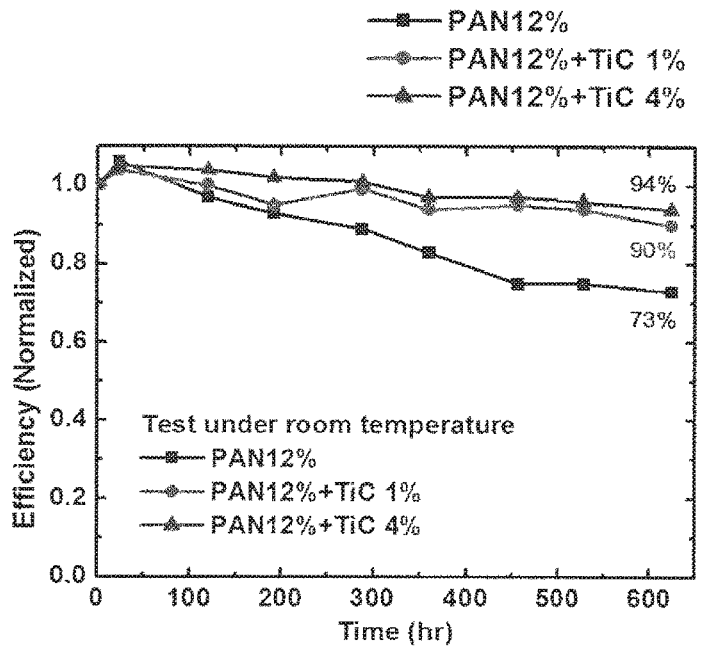

FIGS. 6A-6B are diagrams showing aging tests of the dye-sensitized solar cell devices using different assisting conductive particles according to the present invention. FIG. 6A shows the results of the aging test at room temperature for 500 hours to the dye-sensitized solar cell devices manufactured using gBL as the solvent, 12 wt % PAN as the thickening agent, and different concentrations of $TiO_2$ particles. The normalized photoelectric conversion efficiency of the dye-sensitized solar cell devices manufactured using gBL, 12 wt % Pan and 4 wt % $TiO_2$ maintained 74% of the initial efficiency, which is the best among the group. FIG. 6B shows the test results after replacing the $TiO_2$ with TiC particles. The best concentration of the assisting conductive particles is 4%, and the initial efficiency of the dye-sensitized solar cell device increased to 94%. It is shown that the stability of the dye-sensitized solar cell device manufactured using TiC particles is superior to that using $TiO_2$ particles. The reason is that, as the assisting conductive particles, using $TiO_2$ particles cannot solve the problem of the dye desorption from the $TiO_2$ layer on the working electrode, while using TiC particles dramatically improves this issue.

Figure 6C:
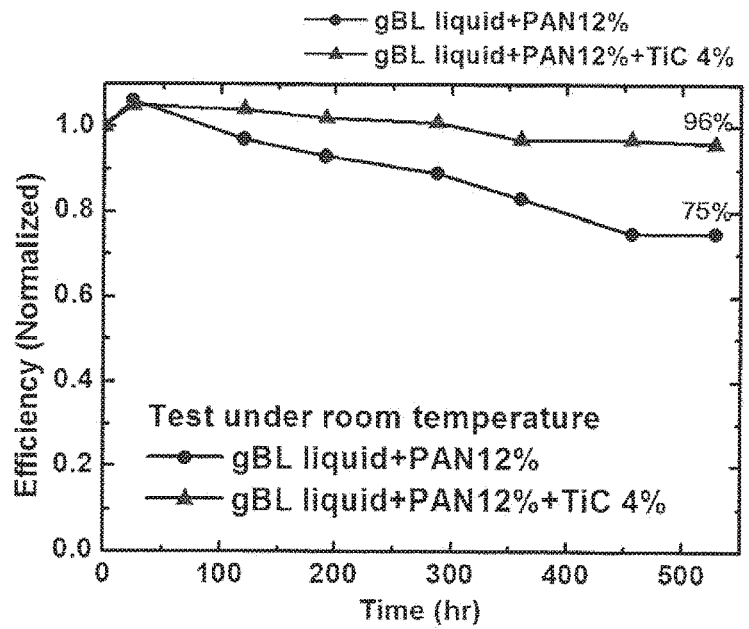
FIGS. 6C-6E are characteristic diagrams showing the aging tests for the dye-sensitized solar cell devices at different temperatures according to the present invention.
Figure 6D:
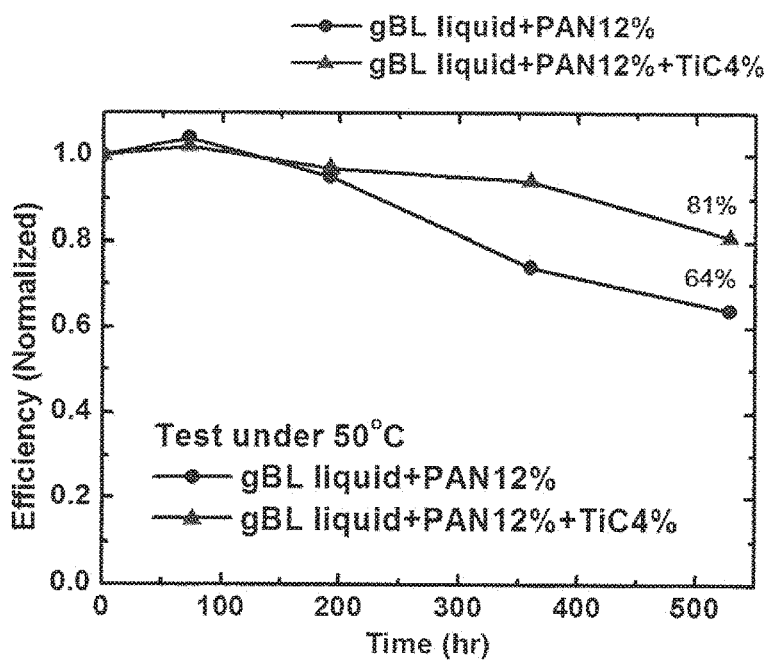
Figure 6E:
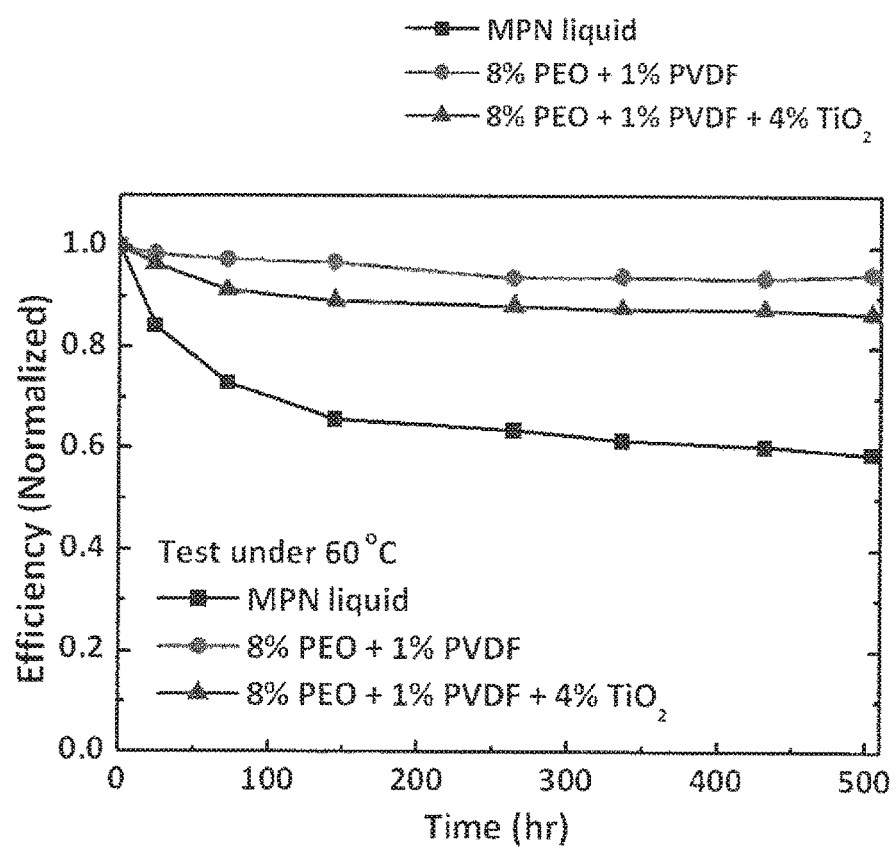

FIGS. 6C-6E are diagrams showing aging tests of the dye-sensitized solar cell devices at different temperatures according to the present invention. FIGS. 6C and 6D show the results comparing the aging tests at room temperature and 50° C. respectively for 500 hours to the dye-sensitized solar cell devices manufactured using gBL as the solvent, and 12 wt % PAN as the thickening agent, with or without the addition of the assisting conductive TiC particles. It is seen that excellent heat durability and stability of the dye-sensitized solar cell devices were obtained when the Tic particles were added. The normalized photoelectric conversion efficiency of the dye-sensitized solar cell devices maintained 81% of the initial efficiency even after aging at 50° C. for 500 hours. FIG. 6E shows the results comparing the characteristics of the dye-sensitized solar cell devices with or without the addition of the assisting conductive $TiO_2$ particles using MPN as the solvent and a mixture of 8 wt % PEO and 1 wt % PVDF as the thickening agent, and after aging tests at two constant temperatures, which are room temperature and 60° C., for 500 hours. It is seen that the heat durability and the stability of the dye-sensitized solar cell device manufactured with the addition of $TiO_2$ particles is excellent. Even after aging at 50° C. for 500 hours, the normalized photoelectric conversion efficiency after degradation can still maintain 87% of the initial efficiency.

According to the above examples and the test results for all of the characteristics, it can be seen that when using the electrolyte solution manufactured by the present invention, because its viscosity is within the printable range, there will not be any occurrence of flowage or leakage of the electrolyte solution during the manufacturing process of the dye-sensitized solar cell devices. In addition, the present invention provides a good solution to solve the problem of dye desorption in the prior art and has excellent photoelectric characteristics, heat durability and stability. Practically, the above-mentioned electrolyte solution, which contains the combination of the polymer and the assisting conductive particles, can be printed on a working electrode using a printing process, such as a screen printing, blade coating or an ink jet printing process. For example, if a screen printing process is selected, a large area screen having multiple printing patterns thereon, which corresponds to a large area substrate, can be utilized, to print multiple unit panels on the large area substrate at one time. This increases the feasibility of mass production by applying the electrolyte solution to the printing process. Therefore, the present invention can not only easily manufacture the dye-sensitized solar cell devices, but it can also improve the processing ability, process safety, stability, and photoelectric conversion efficiency thereof.

Embodiments

1. An electrolyte for a dye-sensitized solar cell, including a solvent being one selected from a group consisting of gamma-butyrolactone (gBL), propylene carbonate (PC) and 3-methoxypropionitrile (MPN); and a polymer mixed with the solvent to form an electrolyte solution, wherein: when the solvent is one of gBL and PC, the polymer is one selected from a group consisting of polyacrylonitrile (PAN), polyvinyl acetate (PVA), polyacrylonitrile-co-vinyl acetate) (PAN-VA) and a combination thereof; and when the solvent is MPN, the polymer includes one of a mixture of poly(ethylene oxide (PEO) and polyvinylidene fluoride (PVDF), and a mixture of PEO and polymethylmethacrylate (PMMA).
2. The electrolyte of Embodiment 1, wherein the electrolyte solution has a viscosity ranged from 1.4 to 40 Pa·s.
3. The electrolyte of any one of Embodiments 1-2, further including at least one selected from a group consisting of iodine, lithium iodide (LiI), 1,3-dimethylimidazolium iodide (DMII), N-methylimidazole (NMBI), and guanidinium thiocyanate (GuSCN).
4. The electrolyte of any one of Embodiments 1-3, wherein when the solvent is gBL, the PAN has a concentration of 4-12 wt %, the PVA has a concentration of 10-30 wt %, and the PAN-VA has a concentration of 7 wt %.
5. The electrolyte of any one of Embodiments 1-4, wherein when the polymer includes the mixture of the PEO and the PVDF, the PEO has a concentration of 8-15 wt %, and the PVDF has a concentration less than 2 wt. %, and when the polymer includes the mixture of the PEO and the PMMA, the PEO has a concentration of 6.1-8.1 wt % and the PMMA has a concentration of 4.375-6.1 wt %.
6. The electrolyte of any one of Embodiments 1-5, wherein when the solvent is PC, the PVA has a concentration of 7-15 wt %.
7. The electrolyte of any one of Embodiments 1-6, further including a nano particle being a material selected from a group consisting of TiC, $TiO_2$, $SiO_2$ and a combination thereof.
8. The electrolyte of any one of Embodiments 1-7, wherein the nano particle has a concentration of 0-10 wt %.
9. The electrolyte of any one of Embodiments 1-8, wherein the electrolyte solution is printable on a substrate.
10. The electrolyte of any one of Embodiments 1-9, wherein the substrate is a $TiO_2$ thin film substrate.
11. The electrolyte of any one of Embodiments 1-10, wherein the electrolyte solution is applied using one method selected from a group consisting of a screen printing, a blade coating and an ink jet printing.
12. An electrolyte for a dye-sensitized cell, including a solvent, and a thickening agent mixed with the solvent to form an electrolyte solution having a viscosity of 1.3-40 Pa·s.
13. The electrolyte of Embodiment 12, wherein the solvent is one selected from a group consisting of gamma-Butyrolactone (gBL), propylene carbonate (PC) and 3-methoxypropionitrile (MPN).
14. The electrolyte of any one of Embodiments 12-13, wherein when the solvent is one of gBL and PC, the thickening agent is one selected from a group consisting of polyacrylonitrile (PAN), polyvinyl acetate (PVA), poly(acrylonitrile-co-vinyl acetate (PAN-VA) and a combination thereof.

15. The electrolyte of any one of Embodiments 12-14, wherein when the solvent is MPN, the thickening agent includes one of a mixture of poly(ethylene oxide (PEO) and polyvinylidene fluoride (PVDF), and a mixture of PEO and polymethylmethacrylate (PMMA).

16. The electrolyte of any one of Embodiments 12-15, wherein the solvent has a saturated evaporation pressure lower than 1 KPa.

17. The electrolyte of any one of Embodiments 12-16, wherein the solvent has a donor number less than or equal to 18 kcal/mol.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An electrolyte for a dye-sensitized solar cell, comprising:
    a solvent; and
    a polymer mixed with the solvent: to form an electrolyte solution, wherein:
    the solvent is MPN, and the polymer includes one of a mixture of polyethylene oxide (PEO) and polyvinylidene fluoride (PVDF), and a mixture of PEO and polymethylmethacrylate (PMMA), wherein
    when the polymer includes the mixture of the PEO and the PVDF, the PEO has a concentration of 8-15 wt %, and the PVDF has a concentration less than 2 wt. %; and
    when the polymer includes the mixture of the PEO and the PMMA, the PEO has a concentration of 6.1-8.1 wt % and the PMMA has a concentration of 4.375-6.1 wt %.

2. An electrolyte according to claim 1, wherein the electrolyte solution has a viscosity ranged from 1.4 to 40 Pa·s.

3. An electrolyte according to claim 1, further comprising at least one selected from a group consisting of iodine, lithium iodide (LiI), 1,3-dimethylimidazolium iodide (DMII), N-methylimidazole (NMBI), and guanidinium thiocyanate (GuSCN).

4. An electrolyte according to claim 1, further comprising a nano particle being a material selected from a group consisting of TiC, $TiO_2$, $SiO_2$ and a combination thereof.

5. An electrolyte according to claim 4, wherein the nano particle has a concentration less than 10 wt %.

6. An electrolyte according to claim 1, wherein the electrolyte solution is printable on a substrate.

7. An electrolyte according to claim 6, wherein the electrolyte solution is printed by one method selected from a group consisting of a screen printing, a blade coating and an ink jet printing.

8. An electrolyte for a dye-sensitized solar cell, comprising:
    a solvent; and
    a polymer mixed with the solvent to form an electrolyte solution, wherein the solvent is PC, and the PVA has a concentration of 7-15 wt %.

9. An electrolyte for a dye-sensitized cell, comprising:
    a solvent, and
    a thickening agent mixed with the solvent to form an electrolyte solution having a viscosity of 1.3-40 Pa·s, wherein the solvent is MPN, the thickening agent includes one of a mixture of poly(ethylene oxide (PEO) and polyvinylidene fluoride (PVDF), and a mixture of PEO and polymethylmethacrylate (PMMA).

10. An electrolyte according to claim 9, wherein the solvent has a saturated evaporation pressure lower than 1 KPa.

11. An electrolyte according to claim 9, wherein the solvent has a donor number less than or equal to 18 kcal/mol.

* * * * *